US010233565B2

United States Patent
Yamada et al.

(10) Patent No.: US 10,233,565 B2
(45) Date of Patent: Mar. 19, 2019

(54) SINGLE-CRYSTAL MANUFACTURING APPARATUS AND METHOD FOR CONTROLLING MELT SURFACE POSITION

(71) Applicant: SHIN-ETSU HANDOTAI CO., LTD., Tokyo (JP)

(72) Inventors: Taiki Yamada, Echizen (JP); Naoki Masuda, Echizen-cho (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/761,495

(22) PCT Filed: Sep. 20, 2016

(86) PCT No.: PCT/JP2016/004280
§ 371 (c)(1),
(2) Date: Mar. 20, 2018

(87) PCT Pub. No.: WO2017/064834
PCT Pub. Date: Apr. 20, 2017

(65) Prior Publication Data
US 2018/0266011 A1  Sep. 20, 2018

(30) Foreign Application Priority Data

Oct. 14, 2015 (JP) ................................. 2015-202572

(51) Int. Cl.
*C30B 15/26* (2006.01)
*C30B 29/06* (2006.01)

(52) U.S. Cl.
CPC ............. *C30B 15/26* (2013.01); *C30B 29/06* (2013.01)

(58) Field of Classification Search
CPC combination set(s) only.
See application file for complete search history.

(56) References Cited

U.S. PATENT DOCUMENTS

| 4,915,775 A | 4/1990 | Katsuoka et al. |
| 8,085,985 B2 | 12/2011 | Urano et al. |

(Continued)

FOREIGN PATENT DOCUMENTS

| JP | S64-024089 A | 1/1989 |
| JP | 2003-026495 A | 1/2003 |

(Continued)

OTHER PUBLICATIONS

Nov. 8, 2016 International Search Report issued in Patent Application No. PCT/JP2016/004280.

(Continued)

*Primary Examiner* — Erin F Bergner
(74) *Attorney, Agent, or Firm* — Oliff PLC

(57) ABSTRACT

A single-crystal manufacturing apparatus including: at least two different melt surface position measuring means for measuring a melt surface position of a material melt; controlling means for controlling the melt surface position based on the measured melt surface position; and determining means for determining whether a measurement abnormality has occurred in the melt surface position measuring means, the apparatus being characterized in that the melt surface position is measured by the plurality of melt surface position measuring means at the same time, one melt surface position measuring means adopted for control over the melt surface position is selected from the plurality of melt surface position measuring means, and the melt surface position measuring means adopted for control over the melt surface position is switched to another melt surface position measuring means when the determining means determines that a measurement abnormality has occurred in the selected melt surface measuring means.

4 Claims, 5 Drawing Sheets

(56) References Cited

U.S. PATENT DOCUMENTS

| | | |
|---|---|---|
| 2011/0114010 A1 | 5/2011 | Hayashida et al. |
| 2011/0146564 A1 | 6/2011 | Ohtsuna et al. |
| 2014/0373774 A1 | 12/2014 | Masuda et al. |

FOREIGN PATENT DOCUMENTS

| | | |
|---|---|---|
| JP | 2007-290906 A | 11/2007 |
| JP | 2010-100452 A | 5/2010 |
| JP | 2013-170097 A | 9/2013 |
| WO | 2009/028273 A1 | 3/2009 |

OTHER PUBLICATIONS

Apr. 17, 2018 International Preliminary Report on Patentability issued in Patent Application No. PCT/JP2016/004280.
Oct. 16, 2018 Office Action issued in Japanese Patent Application No. 2015-202572.

SINGLE-CRYSTAL MANUFACTURING APPARATUS AND METHOD FOR CONTROLLING MELT SURFACE POSITION

TECHNICAL FIELD

The present invention relates to a single-crystal manufacturing apparatus and a method for controlling a melt surface position.

BACKGROUND ART

In manufacture of silicon single crystals, stably manufacturing silicon single crystals having desired quality is important to prevent production loss and enhance a product yield. In particular, a problem lies in how grown-in defects in a silicon single crystal can be reduced and how low-defect silicon single crystal can be stably manufactured due to high integration of semiconductor devices and attendant progress of miniaturization in recent years.

It is known that the grown-in defect is determined based on a temperature gradient of a crystal at a growth interface and a growth rate of the silicon single crystal, and the temperature gradient of the crystal at the growth interface must be highly accurately controlled.

To control the temperature gradient of the crystal at the growth interface, a cylindrical heat insulating component which surrounds a periphery of a silicon single crystal grown above a melt surface and blocks radiant heat is provided in conventional examples. Consequently, a crystal temperature gradient when the crystal has a high temperature can be increased, and a defect-free crystal can be rapidly provided.

As described above, in the silicon single crystal manufacturing apparatus having the heat insulating component provided therein, to accurately control the crystal temperature gradient at the growth interface, a gap between the melt surface and a lower end of the heat insulating component must be accurately controlled to be a predetermined gap.

At the time of growing a silicon single crystal, a silicon melt contained in a crucible reduces with growth of the silicon single crystal, and a melt surface position descends. Thus, there has been conventionally adopted a method for controlling a melt surface position by estimating an amount of descent of the melt surface position in accordance with growth of a silicon single crystal, issuing an ascending instruction to a crucible holding shaft in correspondence with an estimated value, and ascending a crucible position to prevent descent of the melt surface position so that the melt surface position can be maintained constant at a predetermined position.

However, with an increase in diameter of a crucible shape associated with an increase in crystal diameter, the melt surface position largely changes due to a variation in wall thickness of the crucible and deformation and expansion of the crucible which occur during an operation. Thus, it is difficult to accurately control the melt surface position to be maintained at the predetermined position by solely performing such ascent control over a crucible position in correspondence with an estimated value as described above.

Thus, there has been adopted such a method as disclosed in, e.g., Patent Literature 1 or Patent Literature 2, by which a CCD camera configured to measure a melt surface position from the outside of a furnace is provided to an outer portion of a chamber and the melt surface position is accurately controlled to a fixed position based on a measurement result from an image provided by the CCD camera.

Specifically, Patent Literature 1 discloses a method for imaging a reference reflector disposed at a lower end of a heat insulating component present above a silicon melt and the reference reflector reflected on the melt surface which is like a specular surface by using an optical apparatus such as a CCD camera, and measuring a melt surface portion from this video.

Furthermore, Patent Literature 3 discloses a method for comparing a crystal diameter measured by first diameter measuring means using a CCD camera installed at an arbitrary angle to a crystal with a crystal diameter measured by second diameter measuring means using two CCD cameras juxtaposed to both ends of the crystal, and calculating a melt surface position from a difference between the first crystal diameter and the second crystal diameter.

As a method for setting a melt surface position acquired by each of such measuring methods to a desired position, there is adopted a method for calculating a deviation of a current melt surface position from a measured melt surface position and a desired melt surface position, and correcting a crucible ascending rate in correspondence with the calculated deviation so that the melt surface position can be controlled to a desired position.

CITATION LIST

Patent Literatures

Patent Literature 1: Japanese Unexamined Patent Publication (Kokai) No. 2007-290906
Patent Literature 1: Japanese Unexamined Patent Publication (Kokai) No. 2010-100452
Patent Literature 1: Japanese Unexamined Patent Publication (Kokai) No. 2013-170097
Patent Literature 1: Japanese Unexamined Patent Publication (Kokai) No. Hei 01-24089

DISCLOSURE OF INVENTION

Problem to be Solved by the Invention

To stably and accurately perform such control over a melt surface position, such measurement of the melt surface position as described above is always normally carried out as a premise. However, in actual manufacture, there often occurs a problem that stable measurement cannot be performed (which will be also referred to as a measurement abnormality hereinafter) due to various events which happen during manufacture, e.g., a case where measurement cannot be performed due to a failure of melt surface position measuring apparatus such as a CCD camera installed outside a furnace, erroneous measurement of the melt surface position due to breakage of furnace constituent parts such as a reference reflector to measure a melt surface position or a silicon melt adhering to the constituent parts in a furnace, and the like.

When such a measurement abnormality occurs, the melt surface position cannot be controlled to a predetermined position. Consequently, silicon single crystals having desired quality cannot be stably manufactured.

In view of the problem, it is an object of the present invention to provide a single-crystal manufacturing apparatus and a method for controlling a melt surface position which can detect abnormalities and stably control a melt surface position even if measurement abnormalities occur in measurement of the melt surface position.

Means for Solving Problem

To achieve the object, according to the present invention, there is provided a single-crystal manufacturing apparatus which pulls a silicon single crystal from a material melt contained in a crucible by a Czochralski method, comprising:

at least two different melt surface position measuring means for measuring a melt surface position of the material melt; controlling means for controlling the melt surface position based on the measured melt surface position; and determining means for determining whether a measurement abnormality has occurred in the melt surface position measuring means, wherein the melt surface position is measured by the plurality of melt surface position measuring means at the same time, one melt surface position measuring means adopted for control over the melt surface position is selected from the plurality of melt surface position measuring means, and the melt surface position measuring means adopted for control over the melt surface position is switched to another melt surface position measuring means when the determining means determines that a measurement abnormality has occurred in the selected melt surface measuring means.

With such an apparatus, when a measurement abnormality has occurred in measurement of the melt surface position, the melt surface position measuring means adopted for control over the melt surface position is switched to another melt surface position measuring means upon detecting this abnormality, and hence the apparatus which can stably control the melt surface position can be provided.

At this time, it is preferable that the determining means determines whether the measurement abnormality has occurred from an amount of change in value of the melt surface position per unit time, the value being measured by the melt surface position measuring means.

With such an apparatus, it is possible to further assuredly determine whether the measurement abnormality has occurred in the melt surface position measuring means.

Further, according to the present invention, there is provided a method for controlling a melt surface position of a material melt when a silicon single crystal is pulled from the material melt contained in a crucible by a Czochralski method, comprising:

measuring the melt surface position by at least two different melt surface position measuring means at the same time; selecting one melt surface position measuring means adopted for control over the melt surface position from the plurality of melt surface position measuring means; determining whether a measurement abnormality has occurred in the selected melt surface position measuring means; and switching the melt surface position measuring means adopted for control over the melt surface position to another melt surface position measuring means when it is determined that the measurement abnormality has occurred.

With such a method, when a measurement abnormality has occurred in measurement of the melt surface position, the melt surface position measuring means adopted for control over the melt surface position is switched to another melt surface position measuring means upon detecting this abnormality, and hence the melt surface position can be stably controlled.

At this time, it is preferable that in determining whether the measurement abnormality has occurred, whether the measurement abnormality has occurred is determined from an amount of change in value of the melt surface position per unit time, the value being measured by the melt surface position measuring means.

With such a method, it is possible to further assuredly determine whether the measurement abnormality has occurred in the melt surface position measuring means.

Effect of the Invention

According to the single-crystal manufacturing apparatus and the method for controlling a melt surface position of the present invention, when a measurement abnormality has occurred in measurement of a melt surface position, the melt surface position measuring means adopted for control over the melt surface position is switched to another melt surface position measuring means upon detecting this abnormality, and hence the melt surface position can be stably controlled.

BEST MODE(S) FOR CARRYING OUT THE INVENTION

An embodiment of the present invention will now be described hereinafter, but the present invention is not restricted thereto.

As described above, when a measurement abnormality has occurred in measurement of a melt surface position, there arises a problem that the melt surface position cannot be controlled to a predetermined position and silicon single crystals having a desired quality cannot be thereby stably manufactured.

Thus, the present inventors have repeatedly conducted the earnest examination to solve such a problem. Consequently, they have conceived that measurement of a melt surface position of a material melt is performed by at least two different melt surface position measuring means at the same time, and the melt surface position measuring means adopted for control over the melt surface position is switched to another melt surface position measuring means when a measurement abnormality is determined to have occurred in the melt surface position measuring means adopted for control over the melt surface position. Consequently, they have found out that, when the measurement abnormality has occurred in measurement of the melt surface position, the melt surface position measuring means adopted for control over the melt surface position is switched to another melt surface position measuring means upon detecting this abnormality, and hence the melt surface position can be stably controlled. Furthermore, they have fully examined the best mode for carrying out such arrangements, thereby bringing the present invention to completion.

Figure 1:
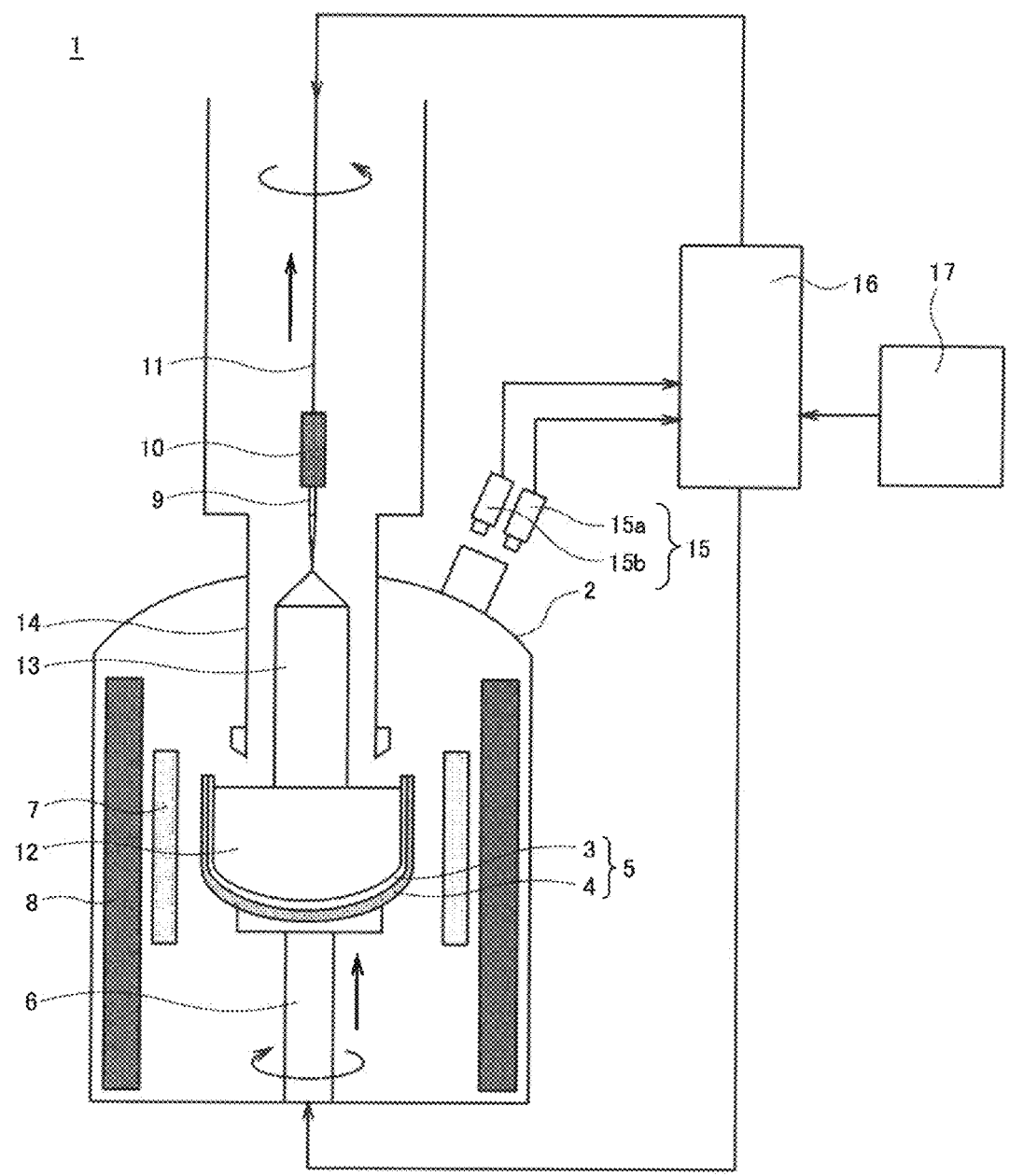
FIG. 1 is a schematic view showing an example of a single-crystal manufacturing apparatus according to the present invention.

A single-crystal manufacturing apparatus according to the present invention will be first described. As shown in FIG. 1, a single-crystal manufacturing apparatus 1 is constituted of a chamber 2, a crucible 5 having a double structure of an inner quartz crucible 3 and an outer graphite crucible 4, a crucible holding shaft 6 which holds the crucible 5, a heater 7 provided at an outer periphery of the crucible 5, a heater insulating material 8 provided at an outer periphery of the heater 7, a seed chuck 10 to hold a seed crystal 9 and a wire 11 to pull the seed chuck 10 which are coaxially provided with the crucible holding shaft 6, and others. Moreover, a cylindrical heat insulating component 14 to block radiant heat is provided above the material melt 12 contained in the crucible 5 to surround a periphery of a grown silicon single crystal 13.

Moreover, the apparatus has at least two different melt surface position measuring means 15 which measure a melt surface position of the material melt 12, controlling means 16 which controls the melt surface position based on a measured melt surface position, and determining means 17 which determines whether a measurement abnormality has occurred in the melt surface position measuring means 15.

A description will now be given as to an example where two means, i.e., first melt surface position measuring means 15a and second melt surface position measuring means 15b are used as at least the two different melt surface position measuring means 15. However, the present invention is not restricted thereto, and at least the two different melt surface position measuring positions 15 may be, e.g., three or more.

As the first and second melt surface position measuring means 15a and 15b, for example, such means as described below can be specifically used. However, the present invention is not restricted thereto, and at least the two different melt surface position measuring means 15 may have the same measuring method or different measuring methods. The case where the measuring methods different from each other are used is preferable since the two means do not affect each other even if a measurement abnormality has occurred in one of them, but it is possible to back up on a failure of a device such as a CCD camera even in the case where the same measuring method is adopted.

Figure 2:
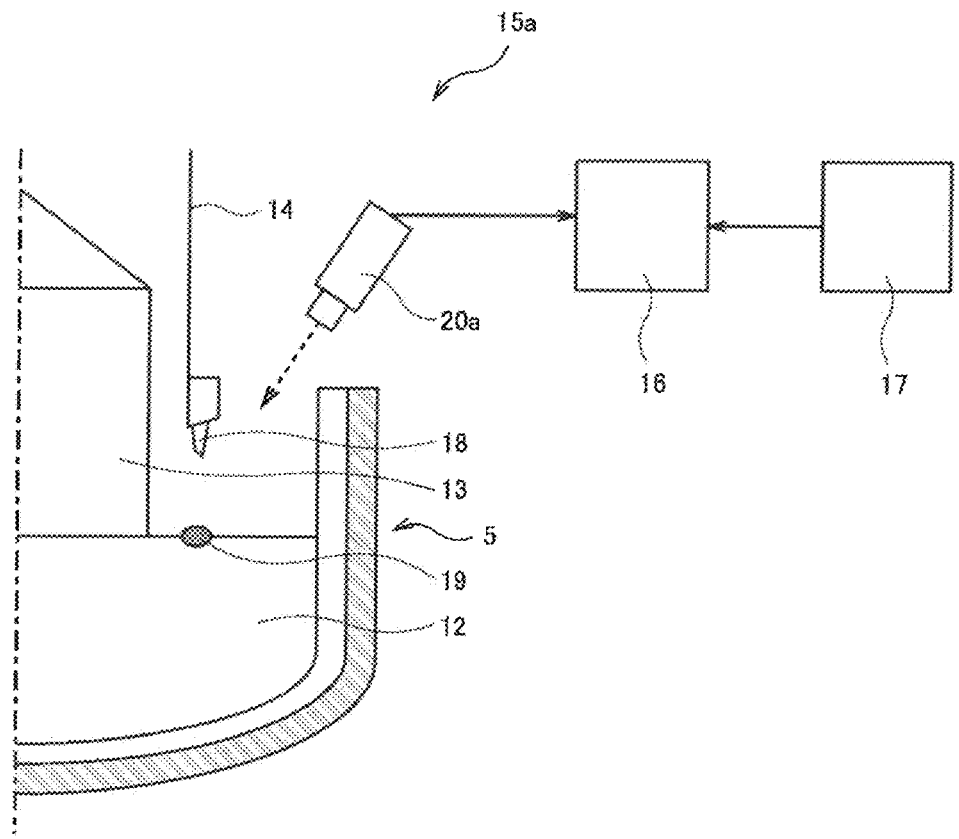
FIG. 2 is a schematic view showing an example of first melt surface position measuring means.

As shown in FIG. 2, in measurement of a melt surface position performed by the first melt surface position measuring means 15a, a reference reflector 18 which is disposed at a lower end of the heat insulating component 14 and fabricated by using a quartz material or the like is used. When the silicon single crystal 13 is manufactured in this state, a reflected image 19 of the reference reflector 18 is shown on a surface of the material melt 12 which is like a specular surface.

The reference reflector 18 and the reflected image 19 at this moment are imaged by a CCD camera 20a installed outside a chamber. Additionally, image processing of this imaging result is performed by the controlling means 16, and a current melt surface position is measured from distances of the reference reflector 18 and the reflected image 19 provided by the image processing.

Figure 3:
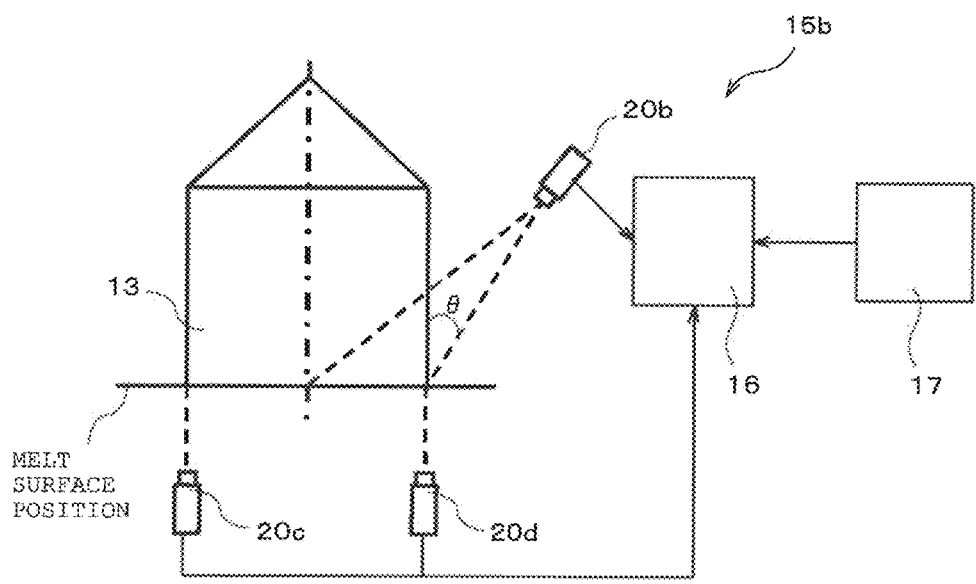
FIG. 3 is a schematic view showing an example of second melt surface position measuring means.

As shown in FIG. 3, in measurement of the melt surface position performed by the second melt surface position measuring means 15b, a CCD camera 20b arranged to form an arbitrary angle θ to the silicon single crystal 13 and CCD cameras 20c and 20d arranged to be juxtaposed to both ends of the silicon single crystal 13 are used.

Figure 4:
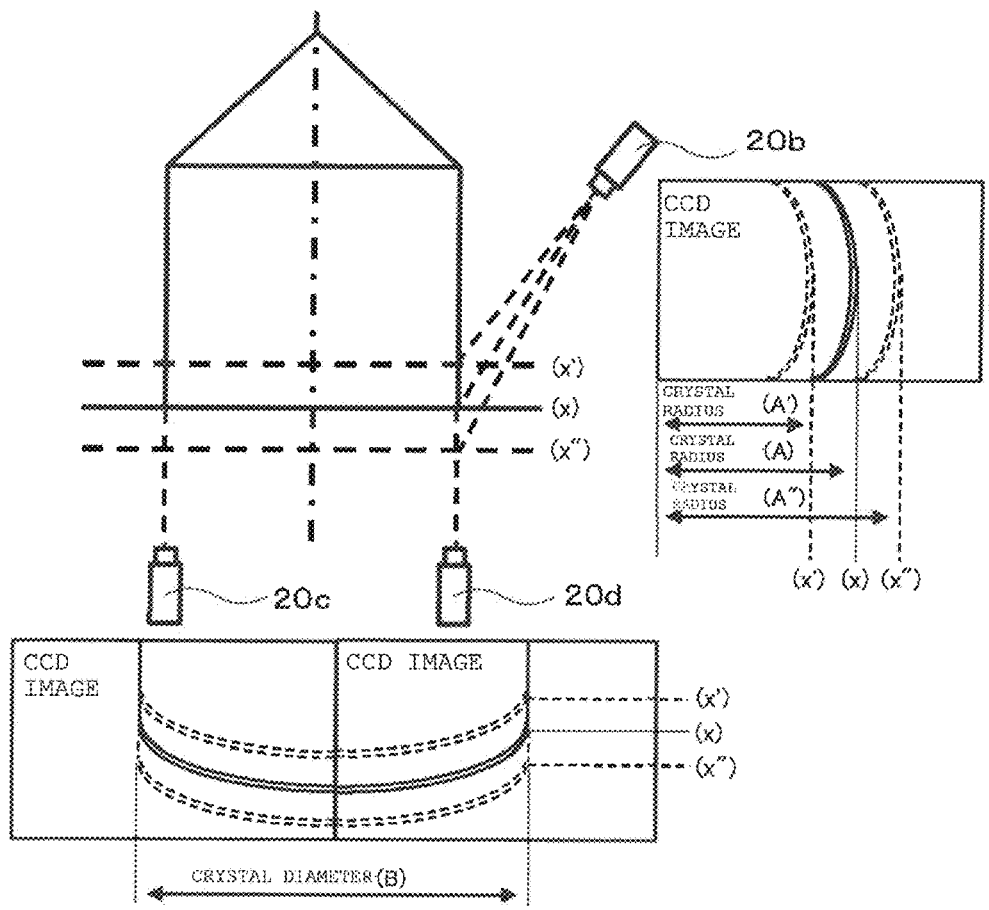
FIG. 4 is an explanatory drawing of the second melt surface position measuring means.

At this time, as shown in FIG. 4, when the melt surface position ascends to (x') or descends to (x") from (x), a first crystal diameter value (a crystal radius A×2) obtained from an image captured by the CCD camera 20b is affected by a change in melt surface position, and the first crystal diameter value changes to (a crystal radius A'×2) or (a crystal radius A"×2). On the other hand, as regards a second crystal diameter (B) obtained from images captured by the two CCD cameras 20c and 20d respectively, a viewing field alone moves up or down with respect to a change in melt surface position, and the second crystal diameter value (B) does not change (Patent Literature 3).

An amount of change in melt surface position during manufacture of the crystal is calculated by the controlling means 16 from a difference between the two types of crystal diameter values produced due to such a change in melt surface position and the installation angle θ of the CCD camera 20b. A current melt surface position can be obtained by combining this amount of change with such a melt surface position measurement result before manufacture of the silicon single crystal as described in Patent Literature 4.

According to such first and second melt surface position measuring means 15a and 15b, their melt surface position measuring methods are different from each other, and hence they do not affect each other even if a measurement abnormality has occurred in one of them.

At the time of pulling the silicon single crystal, the melt surface position is measured by the first and second melt surface position measuring means 15a and 15b at the same time. Further, one melt surface position measuring means which is adopted for control over the melt surface position is selected from the first and second melt surface position measuring means 15a and 15b.

As to the selection at this moment, the melt surface position measuring means is determined, e.g., based on adoption priority of each melt surface position measuring means set in the controlling means 16 in advance while considering a measurement accuracy of each melt surface position measuring means, stability of measurement to events which occur during manufacture of single crystals, and others.

At this time, an operation of a difference between a value of the melt surface position obtained by the selected melt surface position measuring means and preset melt surface position setting data is carried out and the difference is thereby calculated by the controlling means 16. A value of the difference obtained at this moment is a deviation amount of the melt surface position obtained by the measurement to a predetermined melt surface position, and it becomes an amount of melt surface position correction which is performed to adjust the melt surface position to the predetermined position.

Further, a rate correction amount which is supplied to the crucible holding shaft 6 to correct the melt surface position is calculated by an operation of the controlling means 16. The rate correction amount is added to an ascending rate of the crucible position in such a manner that the crucible position ascending rate is increased when the melt surface position is lower than the predetermined position and that this rate is decreased when the melt surface position is higher than the predetermined position. In this manner, the melt surface position is maintained at the predetermined position by performing the melt surface position correction processing to change the crucible position ascending rate in correspondence with the deviation amount of the melt surface position.

The determining means 17 sequentially determines whether a measurement abnormality has occurred in the melt surface position measuring means adopted for control over the melt surface position by checking measurement result data of this adopted means. Consequently, the measurement abnormality can be rapidly detected. As a result of the determination, when occurrence of the measurement abnormality has been detected, the melt surface position measuring means is switched to the other melt surface position measuring means. For example, when the adoption priority of each melt surface position measuring means is set in the controlling means 16 in advance, the melt surface position measuring means is switched to one having the second priority order, and then the control over the melt surface position is continued. It is to be noted that, when occurrence of the measurement abnormality is not detected, the control over the melt surface position is continued as it is without switching the melt surface position measuring means.

Moreover, it is preferable for the determining means 17 to determine whether a measurement abnormality has occurred from an amount of change in value of the melt surface position per unit time, the value being measured by the melt surface position measuring means 15. With such a configuration, it is possible to further assuredly determine whether a measurement abnormality has occurred in the melt surface position measuring means 15.

According to such a single-crystal manufacturing apparatus of the present invention, when a measurement abnormality has occurred in measurement of the melt surface position, the melt surface position measuring means adopted for control over the melt surface position is rapidly switched to the other melt surface position measuring means, and hence the melt surface position can be stably controlled.

Next, a method for controlling a melt surface position of the present invention will now be described. Although an example using the single-crystal manufacturing apparatus 1 of the present invention shown in FIG. 1 will be described here, the present invention is not restricted thereto.

First, a high-purity silicon polycrystal is contained in the crucible 5, heated to approximately 1420° C. or above which is a melting point of silicon by the heater 7, and molten to provide the material melt 12.

Then, the wire 11 is taken down to bring a tip of the seed crystal 9 held by the seed chuck 10 into contact with a surface of the material melt 12. Then, the wire 11 is taken up at a predetermined rate while rotating the crucible holding shaft 6 and the wire 11 in a predetermined rotational direction at a rotating rate, and the seed crystal 9 is thereby pulled to grow the silicon single crystal 13 below the seed crystal 9.

Figure 5:
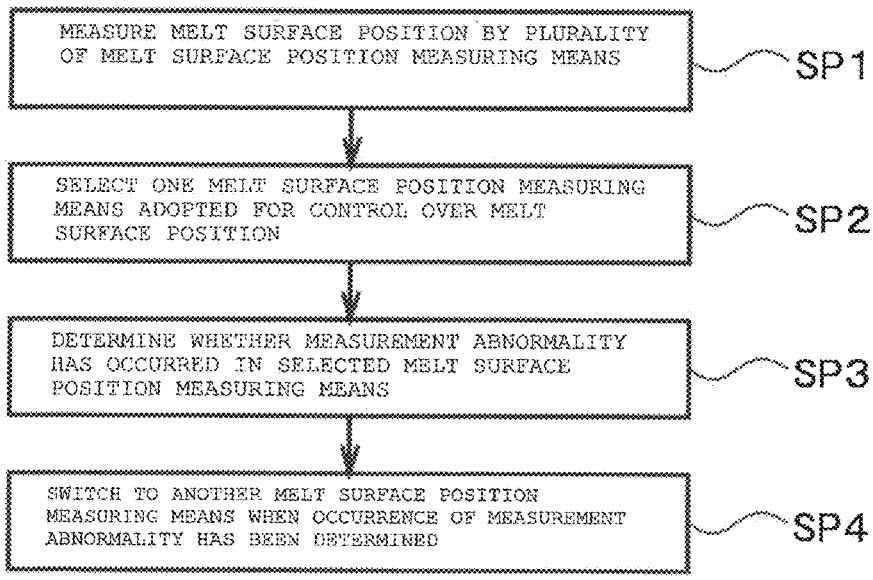
FIG. 5 is a process drawing showing an example of a method for controlling a melt surface position according to the present invention.

At this time, the melt surface position is measured by at least the two different melt surface position measuring means 15 (the first and second melt surface position measuring means 15a and 15b) at the same time (SP1 in FIG. 5).

Further, one melt surface position measuring means adopted for control over the melt surface position is selected from the plurality of melt surface measuring means (SP2 in FIG. 5).

As a method for adopting one of the plurality of melt surface measuring means, any method can be used, and it is desirable to define adoption priority of each melt surface position measuring means in advance while considering, e.g., a measurement accuracy of each melt surface position measuring means, stability of measurement to events which occur during manufacture of single crystals, and others, and to determine the means based on this.

Whether a measurement abnormality has occurred in the selected melt surface position measuring means is determined (SP 3 in FIG. 5).

It is preferable to sequentially determine whether the measurement abnormality has occurred in the melt surface position means selected for control over the melt surface position based on its measurement result data. For example, it is preferable to determine whether the measurement abnormality has occurred from an amount of change in value of the melt surface position per unit time, the value being measured by the melt surface position measuring means. With such an arrangement, whether the measurement abnormality has occurred in the melt surface position measuring means can be rapidly and assuredly determined.

Figure 6:
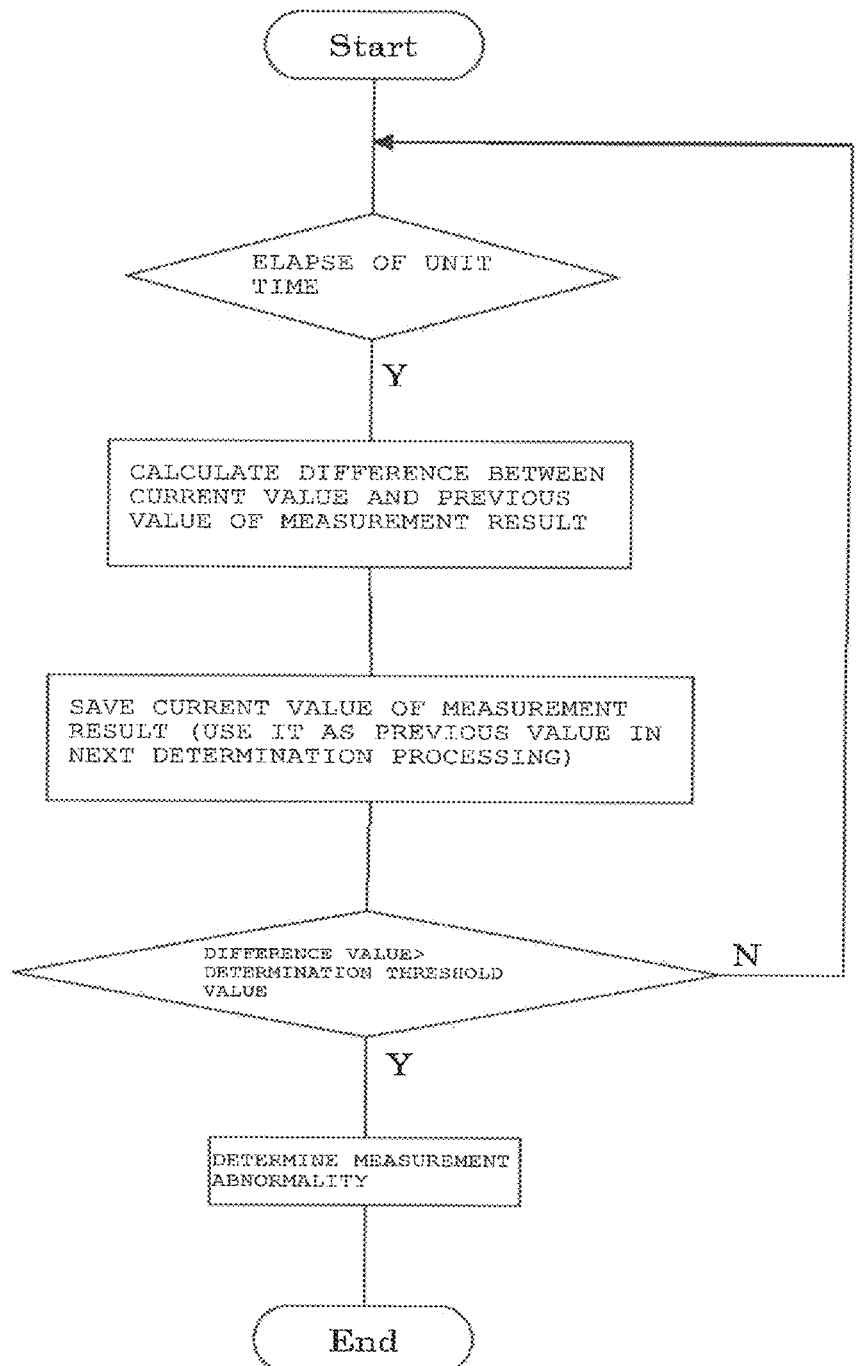
FIG. 6 is a flowchart showing an example of processing to determine whether a measurement abnormality has occurred in determining whether a measurement abnormality has occurred.

At SP3, specifically, determination processing to determine whether the measurement abnormality has occurred in the melt surface position measuring means can be carried out in accordance with such a flowchart as shown in FIG. 6.

As shown in FIG. 6, the determination processing is carried out in accordance with each preset unit time at fixed periods. As to setting of this unit time, it is desirable to set a time which is as short as possible, approximately one minute or less, with respect to a time required for manufacture of the single crystal so that detection of the measurement abnormality by the determination processing and the switching processing are performed immediately after occurrence of the measurement abnormality.

In the determination processing, a difference between a melt surface position measurement result obtained immediately before execution of the determination processing (which will be also referred to as a current value hereinafter) and a previous melt surface position measurement result saved at the time of execution of the determination processing in a preceding cycle (which will be also referred to as a previous value hereinafter) is calculated. The calculated difference means an amount of change in melt surface position during elapse of the set unit time in the crystal manufacturing process (which will be also referred to as an amount of change in melt surface position).

When this amount of change in melt surface position exceeds a determination threshold value which is preset in view of measurement result data in a case where measurement and control of the melt surface position are normally carried out, i.e., the range of a normal amount of change in melt surface position, it can be determined that the measurement abnormality has occurred.

Furthermore, when occurrence of the measurement abnormality has been determined, the melt surface position measuring means adopted for control over the melt surface position is switched to the other melt surface position measuring means (SP4 in FIG. 5).

As described above, when the adoption priority of the melt surface position measuring means has been previously defined, the melt surface position measuring means adopted for control over the melt surface position can be switched to one having the second priority order upon determining occurrence of the measurement abnormality in this manner. Moreover, the switched melt surface position measuring means is used to continue the control over the melt surface position. It is to be noted that, when occurrence of the measurement abnormality is not detected, the control over the melt surface position is continued as it is without switching the melt surface position measuring means.

In this manner, according to the method for controlling a melt surface position of the present invention, when the measurement abnormality has occurred in the measurement of the melt surface position, this is rapidly detected, the melt surface position measuring means adopted for control over the melt surface position is switched to the other melt surface position measuring means, and hence the melt surface position can be stably controlled.

EXAMPLES

The present invention will now be more specifically described hereinafter with reference to an example and comparative example, but the present invention is not restricted thereto.

Example

A silicon single crystal was manufactured by using such a single-crystal manufacturing apparatus of the present invention as shown in FIG. 1 while controlling a melt surface position in accordance with such a method for controlling a melt surface position of the present invention as shown in FIG. 5.

As melt surface position measuring means 15 which measure a melt surface position in a crystal growth process, two means having different measuring methods, i.e., first and second melt surface position measuring means 15a and 15b were installed in the single-crystal manufacturing apparatus 1, respectively. To control the melt surface position, a measurement result of the first melt surface position measuring means 15a was set to be adopted on a priority basis.

The first melt surface position measuring means 15a was configured to use a method as shown in FIG. 2 for imaging such a reference reflector 18 disposed at a lower end of a heat insulating component 14 and a reflected image 19 of the reference reflector 18 reflected on a melt surface which is like a specular surface with the use of an optical apparatus such as a CCD camera 20a, and measuring a melt surface position from this video. Further, the second melt surface position measuring means 15b was configured to use a method as shown FIGS. 3 and 4 for comparing a crystal diameter measured by first diameter measuring means using a CCD camera 20b installed at 45° to a silicon single crystal 13 with a crystal diameter measured by second diameter measuring means using two CCD cameras 20c and 20d juxtaposed to both ends of the silicon single crystal 13, and calculating the melt surface position from this difference.

Furthermore, 360 kg of a silicon polycrystal was put into a crucible 5 having a diameter of 812 mm, and the silicon polycrystal was heated and molten by a heater 7 to provide a silicon melt (a material melt 12). A diameter of the silicon single crystal 13 to be manufactured was set to 300 mm.

A determination on measurement abnormalities of the melt surface position in this example were made every one minute, and a determination threshold value was determined as 1 mm which is an amount of change in melt surface position. Moreover, melt surface position correction processing in the crystal growth process was set in such a manner that correction performed during 50 mm growth of a straight body length was carried out twice, i.e., during the growth of the straight body length of the crystal from 50 mm to 100 mm and during the same from 100 mm to 150 mm. A crucible ascending rate in this example was set to 0.1 mm/min, and an amount of correcting a crucible rate was set to −0.01 mm/min based on a measurement result of the melt surface position.

Figure 7:
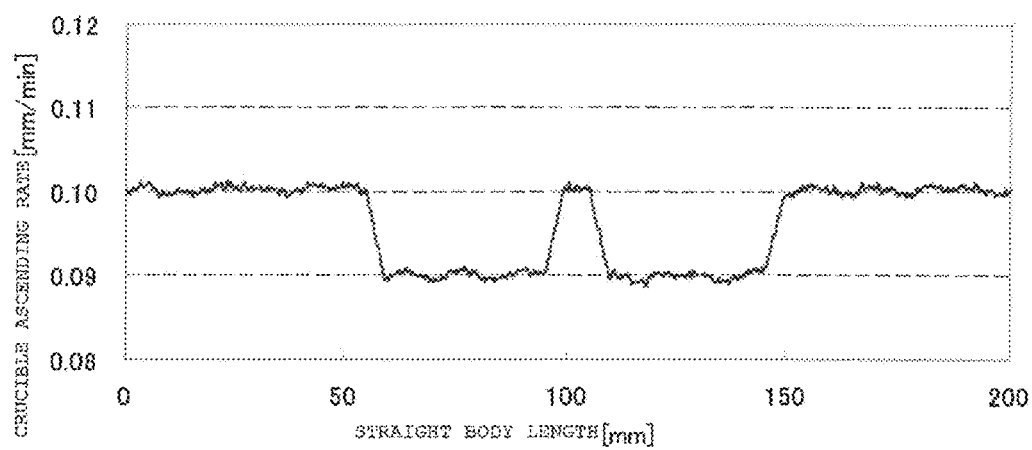
FIG. 7 is a graph showing a crucible ascending rate in Example.

Moreover, in a state where the melt surface position correction processing was carried out, a measurement abnormality was intentionally caused to the first melt surface position measuring means after end of the first correction, and changes in crucible ascending rate before and after occurrence of the measurement abnormality were observed, and they are shown in FIG. 7.

Comparative Example

A silicon single crystal was manufactured by a conventional method. That is, single melt surface position measuring means was used, whether measurement abnormalities had occurred in the melt surface position measuring means was not determined as different from Example. Additionally, like Example, a measurement abnormality was intentionally caused. Changes in crucible ascending rate before and after occurrence of the measurement abnormality in Comparative Example were observed, and they are shown in FIG. 8.

Figure 8:
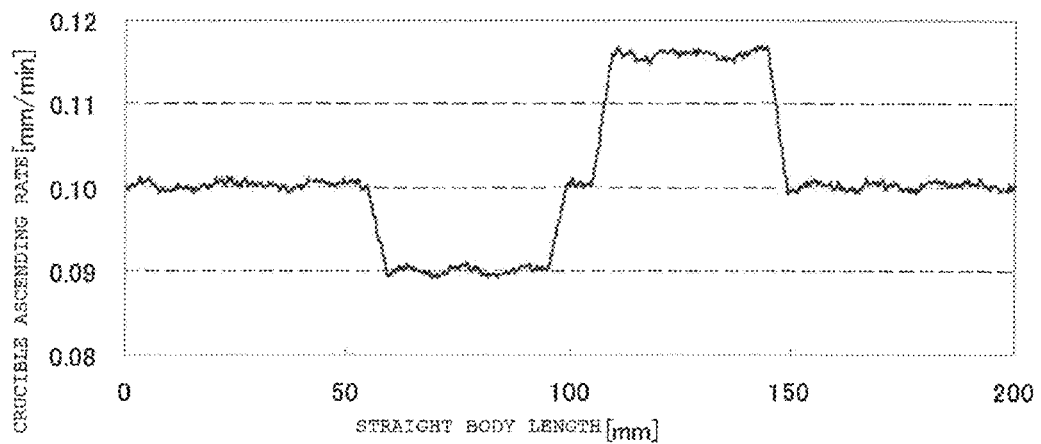
FIG. 8 is a graph showing a crucible ascending rate in Comparative Example.

Consequently, in Comparative Example, as shown in FIG. 8, in the second correction processing where the measurement abnormality was intentionally caused, since a result of measurement which was lower than an actual melt surface position due to the measurement abnormality was applied to the correction processing, the crucible ascending rate correction of +0.015 mm/min was performed although a correction amount of −0.01 mm/min should have been applied.

On the other hand, in Example, as shown in FIG. 7, in the second correction processing where the first melt surface position measuring means had the measurement abnormality, since the control was switched to the melt surface position control processing using a measurement result of the second melt surface position measuring means, the correction of −0.01 mm/min was stably applied, and it can be understood that the melt surface position correction processing was carried out without being affected by occurrence of the measurement abnormality.

As described above, as to the method for controlling a melt surface position, using the present invention enabled stably controlling the melt surface position without being affected by the measurement abnormality which occurs in the measurement of the melt surface position. Consequently, the high-quality silicon single crystal containing a defect-free region was able to be stably and efficiently provided.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

What is claimed is:

1. A single-crystal manufacturing apparatus which pulls a silicon single crystal from a material melt contained in a crucible by a Czochralski method, comprising:
   two or more same or different melt surface position measuring devices configured to simultaneously measure a melt surface position of the material melt by acquiring image data, the two or more melt surface position measuring devices comprising:
   (i) a first measuring device comprising:
      a reference reflector suspended over the melt surface; and
      a CCD camera configured to image the reference reflector and a reflected image of the reference reflector shown on the melt surface; and/or (ii) a second measuring device comprising:
  a CCD camera configured to image a first position of a crystal diameter at an angle with respect to the silicon single crystal; and
  second and third CCD cameras positioned to be juxtaposed to both ends of the silicon single crystal and configured to image a second position of the crystal diameter; and
one or more controllers programmed to:
  adjust a crucible position ascending rate based on the image data acquired by a selected one of the two or more melt surface position measuring devices;
  determine whether an abnormality has occurred in the selected one of the two or more melt surface position measuring devices; and
  if an abnormality is determined to have occurred, switch an adoption priority order of the two or more melt surface position measuring devices.

2. The single-crystal manufacturing apparatus according to claim 1,
  wherein the one or more controllers are programmed to determine whether the measurement abnormality has occurred from an amount of change in value of the melt surface position per unit time, the value being measured by the selected one of the two or more melt surface position measuring devices.

3. A method for controlling a melt surface position of a material melt when a silicon single crystal is pulled from the material melt contained in a crucible by a Czochralski method using a single-crystal manufacturing apparatus of claim 1, the method comprising:
  measuring the melt surface position by the two or more melt surface position measuring devices at the same time;
  selecting one of the two or more melt surface position measuring devices adopted for adjusting the crucible position ascending rate;
  determining whether a measurement abnormality has occurred in the selected one of the two or more melt surface position measuring devices; and
  switching the selected one of the two or more melt surface position measuring devices adopted for adjusting the crucible position ascending rate to another one of the two or more melt surface position measuring devices when it is determined that the measurement abnormality has occurred.

4. The method for controlling a melt surface position according to claim 3,
  wherein, in determining whether the measurement abnormality has occurred, whether the measurement abnormality has occurred is determined from an amount of change in value of the melt surface position per unit time, the value being measured by the selected one of the two or more melt surface position measuring devices.

* * * * *